US012628423B2

(12) United States Patent
Liu

(10) Patent No.: US 12,628,423 B2
(45) Date of Patent: May 12, 2026

(54) DISPLAY PANEL AND METHOD FOR FABRICATING SAME

(71) Applicant: Guangzhou China Star Optoelectronics Semiconductor Display Technology Co., LTD., Guangzhou (CN)

(72) Inventor: Qi Liu, Guangzhou (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 1092 days.

(21) Appl. No.: 17/761,222

(22) PCT Filed: Mar. 2, 2022

(86) PCT No.: PCT/CN2022/078767
§ 371 (c)(1),
(2) Date: Aug. 31, 2023

(87) PCT Pub. No.: WO2023/159662
PCT Pub. Date: Aug. 31, 2023

(65) Prior Publication Data
US 2024/0113129 A1      Apr. 4, 2024

(30) Foreign Application Priority Data
Feb. 22, 2022      (CN) .......................... 202210159797.4

(51) Int. Cl.
*H10D 86/60*        (2025.01)
*H10D 86/01*        (2025.01)
*H10D 86/40*        (2025.01)
(52) U.S. Cl.
CPC ........... *H10D 86/60* (2025.01); *H10D 86/021* (2025.01); *H10D 86/423* (2025.01)

(58) Field of Classification Search
CPC .... H10D 86/60; H10D 86/021; H10D 86/423; H10D 30/6755; H10D 99/00; H10D 30/6704
(Continued)

(56) References Cited

U.S. PATENT DOCUMENTS 9,196,740 B2 * 11/2015 Chou ................. H10D 30/6755
2012/0085999 A1      4/2012 Song et al.
(Continued)

FOREIGN PATENT DOCUMENTS

CN        108878264        11/2018
CN        113745246        12/2021
(Continued)

OTHER PUBLICATIONS

International Search Report and the Written Opinion Dated Aug. 11, 2022 From the International Searching Authority Re. Application No. PCT/CN2022/078767 and its Translation into English. (21 Pages).
(Continued)

*Primary Examiner* — Monica D Harrison

(57)        ABSTRACT

A display panel and a method for fabricating the same are provided. The display panel includes a transistor layer. The transistor layer includes an oxide active layer and a first photocatalytic layer that are stacked. The first photocatalytic layer is made of a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV.

20 Claims, 15 Drawing Sheets

<u>10</u>

(58) Field of Classification Search
USPC ........................................................ 257/72
See application file for complete search history.

(56) References Cited

U.S. PATENT DOCUMENTS

| | | | |
|---|---|---|---|
| 2015/0346478 A1* | 12/2015 | Kim | ................... H10D 30/6723 |
| | | | 438/126 |
| 2018/0090620 A1 | 3/2018 | Morosawa | |
| 2018/0117577 A1* | 5/2018 | Nagpal | .................... C25B 1/04 |

FOREIGN PATENT DOCUMENTS

| CN | 113985667 | 1/2022 |
|---|---|---|
| CN | 114089569 | 2/2022 |
| CN | 114171539 | 3/2022 |
| CN | 114171603 | 2/2023 |

OTHER PUBLICATIONS

Notification of Office Action and Search Report Dated Dec. 15, 2022 From the State Intellectual Property Office of the People's Republic of China Re. Application No. 202210159797.4 and Its Translation Into English. (17 Pages).

* cited by examiner

DISPLAY PANEL AND METHOD FOR FABRICATING SAME

RELATED APPLICATIONS

This application is a National Phase of PCT Patent Application No. PCT/CN2022/078767 having International filing date of Mar. 2, 2022, which claims the benefit of priority of Chinese Patent Application No. 202210159797.4 filed on Feb. 22, 2022. The contents of the above applications are all incorporated by reference as if fully set forth herein in their entirety.

FIELD AND BACKGROUND OF THE INVENTION

The present disclosure relates to the technical field of display, and particularly to a display panel and a method for fabricating the same.

Currently, oxide transistors are widely used in display panels to replace conventional amorphous silicon (a-Si) transistors due to their high mobility, good uniformity, large-area fabrication, good bending resistance, and easy integration. However, film layers of a display panel will generate free hydrogen ions during a preparation process or a use process. An active layer of each oxide transistor is sensitive to hydrogen ions. A current film layer for blocking hydrogen ions has a poor effect of blocking hydrogen ions, causing hydrogen ions to enter an oxide active layer. As a result, a threshold voltage (Vth) is easily negatively shifted, which reduces electrical stability and makes a display panel comprising oxide transistors poor in quality and reliability.

SUMMARY OF THE INVENTION

The present disclosure provides a display panel and a method for fabricating the same, so as to solve the technical problem that a film layer has a poor performance of blocking hydrogen ions in the prior art.

The present disclosure provides a display panel comprising a substrate and a transistor layer. The transistor layer is disposed on the substrate. The transistor layer comprises an oxide active layer and a first photocatalytic layer that are stacked. The first photocatalytic layer is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV.

In an embodiment, at least one of a band gap of the first material and a band gap of the second material is greater than 1.23 eV.

In an embodiment, at least one of the band gap of the first material and the band gap of the second material is greater than 1.8 eV.

In an embodiment, the first material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn—$Fe_2O_3$, $Ta_2O_5$, Pt, $Ta_3N_5$, g-$C_3N_4$, $BiFeO_3$, CoOx—$Mo_2N$, $Ge_3N_4$, $ZnInS_4$, $Cs_2O$, $Bi_2O_3$, InSe, or $Zr_2CO_2$, and the second material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn—$Fe_2O_3$, $Ta_2O_5$, Pt, $Ta_3N_5$, g-$C_3N_4$, $BiFeO_3$, CoOx—$Mo_2N$, $Ge_3N_4$, $ZnInS_4$, $Cs_2O$, $Bi_2O_3$, InSe, or $Zr_2CO_2$.

In an embodiment, the first photocatalytic layer and the oxide active layer are sequentially stacked on the substrate.

In an embodiment, the transistor layer further comprises a gate electrode, an insulating layer, a source electrode, a drain electrode, a first passivation layer, and a second passivation layer. The gate electrode is disposed on the substrate. The insulating layer is disposed on the substrate and the gate electrode. The oxide active layer is disposed on the insulating layer and is disposed corresponding to the gate electrode. The source electrode and the drain electrode are disposed in a same layer and are disposed on the oxide active layer at intervals. The first passivation layer is disposed on the insulating layer, the oxide active layer, the source electrode, and the drain electrode. The first photocatalytic layer and the second passivation layer are sequentially stacked on the first passivation layer.

In an embodiment, the insulating layer comprises a first sublayer and a second sublayer that are sequentially stacked on the substrate and the gate electrode. The oxide active layer is disposed on the second sublayer.

In an embodiment, the first sublayer is made of silicon nitride, and the second sublayer is made of one or more of aluminum oxide and silicon oxide.

In an embodiment, the display panel further comprises a second photocatalytic layer disposed between the oxide active layer and the insulating layer.

In an embodiment, the transistor layer further comprises a source electrode, a drain electrode, an insulating layer, and a gate electrode. The source electrode and the drain electrode are disposed in a same layer and are disposed on the substrate at intervals. The oxide active layer is disposed on the substrate, the source electrode, and the drain electrode. The first photocatalytic layer is disposed on the oxide active layer and the substrate. The insulating layer is disposed on the first photocatalytic layer. The gate electrode is disposed on the insulating layer and is disposed corresponding to the oxide active layer.

In an embodiment, the transistor layer further comprises a buffer layer. The buffer layer is disposed on the substrate. The source electrode and the drain electrode are disposed in the same layer and disposed on the buffer layer at intervals.

In an embodiment, the first photocatalytic layer is made of a mixture of the first material and the second material.

In an embodiment, the first photocatalytic layer comprises a first photocatalytic sublayer and a second photocatalytic sublayer that are sequentially stacked on a side of the oxide active layer away from the substrate. The first photocatalytic sublayer is made of the first material. The second photocatalytic layer is made of the second material.

The present disclosure further provides a method for fabricating a display panel, which comprises: providing a substrate; and forming a first photocatalytic layer on the substrate and forming an oxide active layer on the first photocatalytic layer, or forming the oxide active layer on the substrate and forming the first photocatalytic layer on the oxide active layer. The first photocatalytic layer is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV.

In an embodiment, at least one of a band gap of the first material and a band gap of the second material is greater than 1.23 eV.

In an embodiment, at least one of the band gap of the first material and the band gap of the second material is greater than 1.8 eV.

In an embodiment, the first material comprises $TiO_2$, $\beta$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn—$Fe_2O_3$, $Ta_2O_5$, Pt, $Ta_3N_5$, g-$C_3N_4$, $BiFeO_3$, CoOx—$Mo_2N$, $Ge_3N_4$, $ZnInS_4$, $Cs_2O$, $Bi_2O_3$, InSe, or $Zr_2CO_2$, and the second material comprises $TiO_2$, $\beta$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn—$Fe_2O_3$, $Ta_2O_5$, Pt, $Ta_3N_5$, g-$C_3N_4$, $BiFeO_3$, CoOx—$Mo_2N$, $Ge_3N_4$, $ZnInS_4$, $Cs_2O$, $Bi_2O_3$, InSe, or $Zr_2CO_2$.

In an embodiment, the forming the first photocatalytic layer on the substrate and forming the oxide active layer on the first photocatalytic layer comprises: mixing and disposing the first material and the second material on the substrate to form the first photocatalytic layer; and forming the oxide active layer on the first photocatalytic layer.

In an embodiment, the forming the first photocatalytic layer on the substrate and forming the oxide active layer on the first photocatalytic layer comprises: forming a first photocatalytic sublayer of the first photocatalytic layer with the first material on the substrate; forming a second photocatalytic sublayer of the first photocatalytic layer with the second material on the first photocatalytic sublayer; and forming the oxide active layer on the second photocatalytic sublayer.

In an embodiment, before the forming the first photocatalytic layer on the substrate and forming the oxide active layer on the first photocatalytic layer, the method further comprises: forming a gate electrode on the substrate; and forming an insulating layer on the gate electrode.

The present disclosure provides a display panel and a method for fabricating the same. The display panel comprises a substrate and a transistor layer. The transistor layer is disposed on the substrate. The transistor layer comprises an oxide active layer and a first photocatalytic layer that are stacked. The first photocatalytic layer is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV. In the present disclosure, at least two materials with different energy levels are used to form the first photocatalytic layer, and at least one of the conduction band energy level of the first material and the conduction band energy level of the second material is less than 0 eV, which improves a performance of the first photocatalytic layer to block hydrogen ions, thereby preventing hydrogen ions from penetrating into the oxide active layer and improving a performance of the display panel.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. Furthermore, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device. In the present disclosure, a "reaction" may be a chemical reaction or a physical reaction.

The present disclosure provides a display panel and a method for fabricating the same. The display panel comprises a substrate and a transistor layer. The transistor layer is disposed on the substrate. The transistor layer comprises an oxide active layer and a first photocatalytic layer that are stacked. The first photocatalytic layer is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV.

In the present disclosure, at least two materials with different energy levels are used to form the first photocatalytic layer, and at least one of the conduction band energy level of the first material and the conduction band energy level of the second material is less than 0 eV, which improves a performance of the first photocatalytic layer to block hydrogen ions, thereby preventing hydrogen ions from penetrating into the oxide active layer and improving a performance of the display panel.

Details are as follows.

Figure 1:
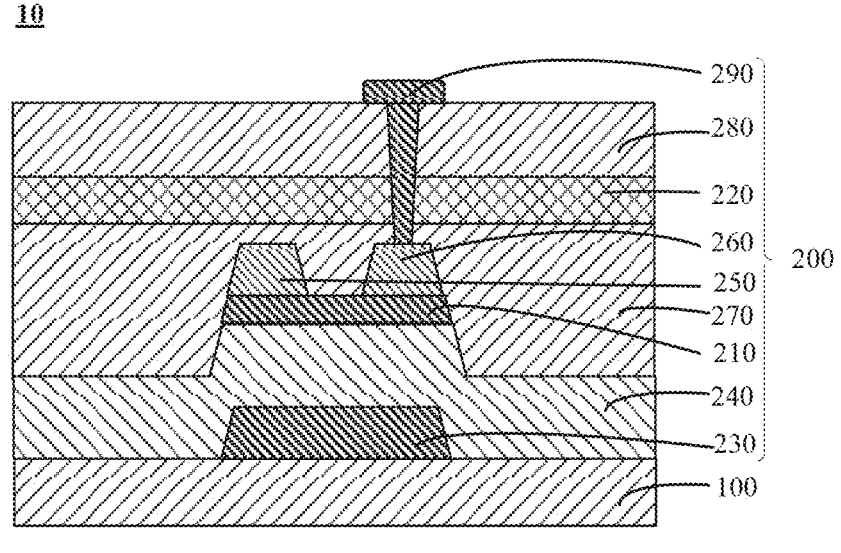
FIG. 1 is a schematic diagram of a first structure of display panel according to an embodiment of the present disclosure.

Please refer to FIG. 1, which is a schematic diagram of a first structure of display panel according to an embodiment of the present disclosure. The present disclosure provides a display panel 10. The display panel 10 comprises a substrate 100 and a transistor layer 200. The transistor layer 200 is disposed on the substrate 100. The transistor layer 200 comprises an oxide active layer 210 and a first photocatalytic layer 220.

In an embodiment, the transistor layer 200 further comprises a gate electrode 230, an insulating layer 240, a source electrode 250, a drain electrode 260, a first passivation layer 270, a second passivation layer 280, and a pixel electrode 290. The gate electrode 230 is disposed on the substrate 100. The insulating layer 240 is disposed on the substrate 100 and the gate electrode 230. The oxide active layer 210 is disposed on the insulating layer 240 and is disposed on the gate electrode 230. The oxide active layer 210 is made of one or more of IGZO, $Ga_2O_3$, ZnMgO, and $SnO_2$. The source electrode 250 and the drain electrode 260 are disposed on the oxide active layer 210 at intervals. The gate electrode 230, the insulating layer 240, the source electrode 250, the drain electrode 260, and the oxide active layer 210 constitute one transistor of the transistor layer 200. The insulating layer 240 is made of one or more of silicon nitride, silicon oxide, and aluminum oxide. The first passivation layer 270 is disposed on the insulating layer 240, the oxide active layer 210, the source electrode 250, and the drain electrode 260. The first passivation layer 270 is made of one or both of silicon oxide and aluminum oxide. The first photocatalytic layer 220 and the second passivation layer 280 are sequentially stacked on the first passivation layer 270. The second passivation layer 280 is made of silicon nitride. The first passivation layer 270, the first photocatalytic layer 220, and the second passivation layer 280 constitute one passivation layer of the transistor layer 200. The pixel electrode 290 is disposed on the second passivation layer 280 and is connected to the drain electrode 260 through a via hole.

The first photocatalytic layer 220 is made of at least a first material and a second material. A conduction band energy level (CB) of the first material is less than a conduction band energy level (CB) of the second material. The conduction band energy level (CB) of the first material is staggered from the conduction band energy level (CB) of the second material, or a valence band energy level (VB) of the first material is staggered from a valence band energy level (VB) of the second material. At least one of the conduction band energy level (CB) of the first material and the conduction band energy level (CB) of the second material is less than 0 eV. Specifically, at least one of the conduction band energy level (CB) of the first material and the conduction band energy level (CB) of the second material is less than 0 eV, −0.2 eV, −1 eV, −1.5 eV, −2 eV, −2.5 eV, −3 eV, or the like.

In an embodiment, the first photocatalytic layer 220 may be made of a mixture of the first material and the second material.

In an embodiment, the first material and the second material are not mixed. That is, the first material alone forms a first photocatalytic sublayer, and the second material alone forms a second photocatalytic sublayer. The first photocatalytic sublayer and the second photocatalytic sublayer are stacked to form the first photocatalytic layer 220. The first photocatalytic sublayer and the second photocatalytic sublayer are sequentially stacked on a surface of the first passivation layer 270 away from the substrate 100, or the second photocatalytic sublayer and the first photocatalytic sublayer are sequentially stacked on the surface of the first passivation layer 270 away from the substrate 100.

In the present disclosure, at least two materials with different valence band energy levels (VB) or conduction band energy levels (CB) are used to form the first photocatalytic layer 220, and at least one of the conduction band energy level (CB) of the first material and the conduction band energy level (CB) of the second material is set to be less than 0 eV, so that two or more materials with different valence band energy levels (VB) are in contact with each other to form a heterojunction layer, or two or more materials with different conduction band energy levels (CB) are in contact with each other to form a heterojunction layer. Therefore, the first photocatalytic layer 220 has high charge separation capability, high charge mobility, and long-lived photo-generated carriers under pure illumination conditions, and achieves local separation of incompatible oxidation and reduction reactions in a nanoscale space. This improves a photocatalytic performance of the first photocatalytic layer 220. That is, the first photocatalytic layer 220 is formed of at least two materials with different valence band energy levels (VB) or conduction band energy levels (CB), so as to improve generation of efficient photo-generated electron-hole pairs (i.e. carriers) by the first photocatalytic layer 220 under pure illumination conditions, thereby improving a performance of the first photocatalytic layer 220 to reduce hydrogen ions. This improves a performance of the first photocatalytic layer 220 to block penetration of hydrogen ions into the oxide active layer 210, thereby improving a performance of the display panel 10.

If the first photocatalytic layer 220 is made of a material with a valence band energy level or a conduction band energy level, the first photocatalytic layer 220 has poor photo-generated charge separation efficiency under pure illumination conditions. Furthermore, sacrificial electron donors or sacrificial hole donors must be added to continue a reaction. That is, if no sacrificial electron or hole donors are added, the reaction will stop due to recombination of electrons and holes, so that a performance of the first photocatalytic layer 220 to block hydrogen ions is reduced, and even the first photocatalytic layer 220 has no function of blocking hydrogen ions, thereby degrading the performance of the display panel 10.

In an embodiment, at least one of the first material and the second material is a semiconductor material. In the present disclosure, at least one of the first material and the second material is set as a semiconductor material, so that the first photocatalytic layer 220 has a function of splitting water.

In an embodiment, at least one of a band gap of the first material and a band gap of the second material is greater than 1.23 eV. Specifically, at least one of the band gap of the first material and the band gap of the second material may be greater than 1.23 eV, 2.4 eV, 2.7 eV, 3 eV, 3.2 eV, 3.8 eV, 4.5 eV, 9 eV, or the like.

In the present disclosure, at least one of the band gap of the first material and the band gap of the second material is set to be greater than 1.23 eV, so as to further improve a performance of the first photocatalytic layer 220 for water splitting, thereby further improving a performance of the first photocatalytic layer 220 in blocking water to erode the oxide active layer 210, and further improving the performance of the display panel 10.

In an embodiment, at least one of the band gap of the first material and the band gap of the second material is greater than 1.8 eV. Specifically, at least one of the band gap of the first material and the band gap of the second material may be greater than 1.8 eV, 2.4 eV, 2.7 eV, 3 eV, 3.2 eV, 3.8 eV, 5 eV, 8 eV, 9 eV, 12 eV, 20 eV, or the like.

In the present disclosure, at least one of the band gap of the first material and the band gap of the second material is set to be greater than 1.8 eV, so as to prevent overvoltage from affecting photocatalytic reaction, which further improves a performance of the first photocatalytic layer 220 for water splitting, thereby further improving a performance of the first photocatalytic layer 220 in blocking water to erode the oxide active layer 210, and further improving the performance of the display panel 10.

Figure 2:
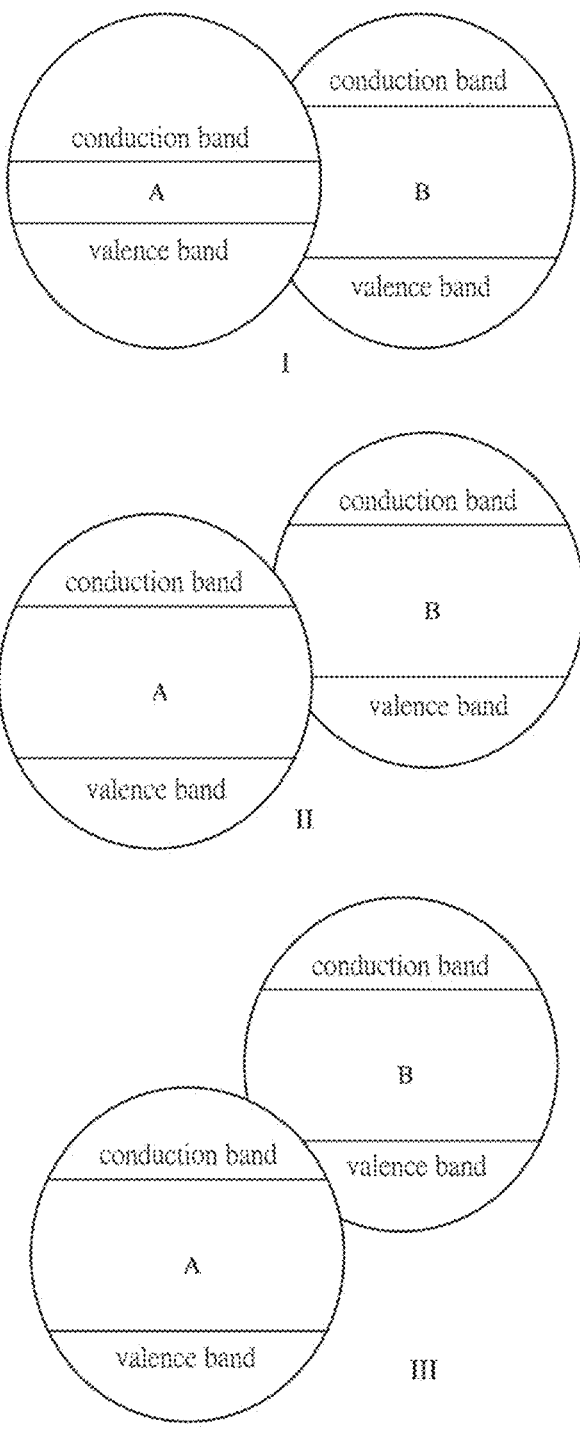
FIG. 2 is a schematic diagram of energy levels of a first material and a second material in the display panel according to an embodiment of the present disclosure.

Please refer to FIG. 2, which is a schematic diagram of energy levels of a first material and a second material in the display panel according to an embodiment of the present disclosure. For example, when the first photocatalytic layer 220 is made of two materials with different valence band energy levels or conduction band energy levels, a heterojunction of the first photocatalytic layer 220 may be a type I heterojunction, a type II heterojunction, a type III heterojunction, or the like. In the type I heterojunction, a conduction band energy level of a material B is higher than a conduction band energy level of a material A, and a valence band energy level of the material B is lower than a valence band energy level of the material A. Therefore, both photo-generated electrons and holes are transferred from the material B to the material A, and a photocatalytic activity of a system is determined by a net charge accumulated on the material A. In the type II heterojunction, the conduction band energy level of the material B is more negative than the conduction band energy level of the material A, so photo-generated electrons flow from the material B to the material A, and photo-generated holes flow from the material A with the more positive valence band energy level to the material B. Therefore, both separation and migration of photo-generated carriers are promoted. A large number of electrons on a surface of the material A and a large number of holes on a surface of the material B can participate in reduction and oxidation reactions, respectively, so the photocatalytic performance is greatly enhanced. In the type III heterojunction, both the conduction band energy level and the valence band energy level of the material B are higher than the conduction band energy level and the valence band energy level of the material A.

Figure 3:
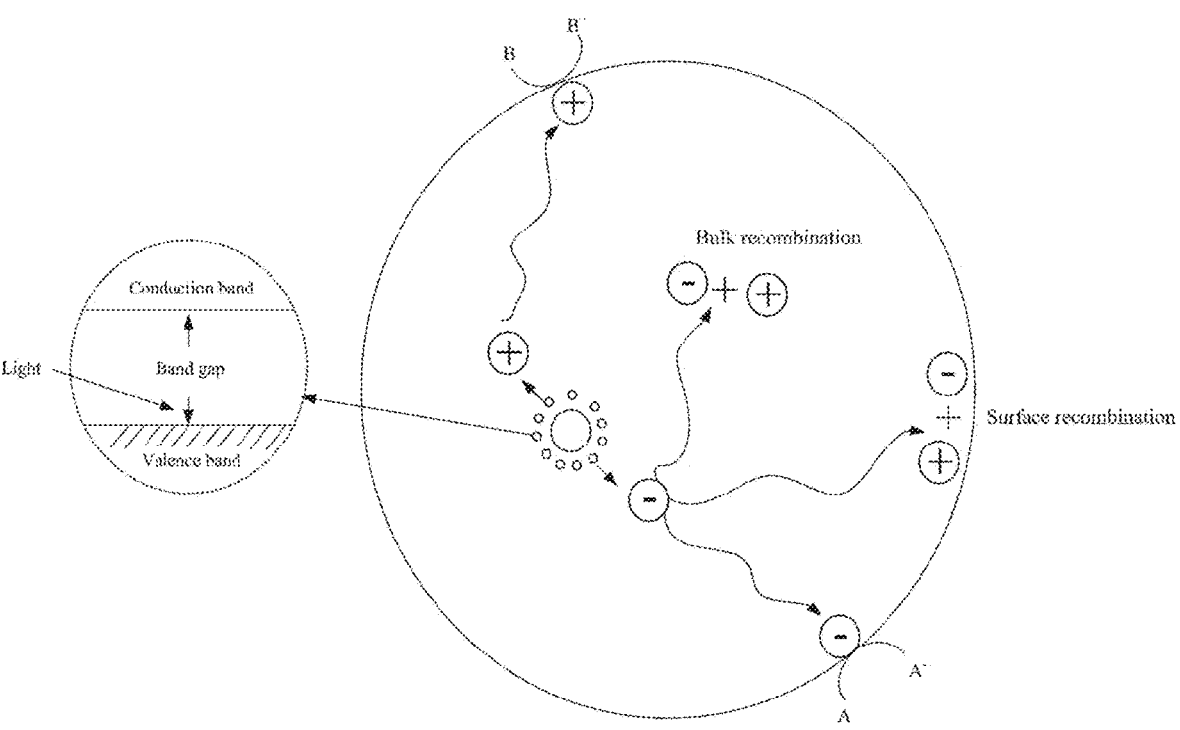
FIG. 3 is a schematic diagram of a catalytic mechanism of a first photocatalytic layer in the display panel according to an embodiment of the present disclosure.

Please refer to FIG. 3, which is a schematic diagram of a catalytic mechanism of a first photocatalytic layer 220 in the display panel 10 according to an embodiment of the present disclosure. A basic principle of photocatalysis is as follows.

When one material absorbs photons with energy greater than or equal to its band gap (hv≥Eg), electrons (e) in a valence band (VB) of the material are excited to a conduction band (CB) of the material, and holes ($h^+$) stay in the valence band (VB), thus forming photo-generated electron-hole pairs. At this time, the material is in a photo-excited state, and an energy difference between the valence band (VB) and the conduction band (CB) is called the band gap. Some of the excited photo-generated electrons and holes recombine in a bulk or surface of the material to release heat during a migration process, and the others successfully migrate to the surface of the material to participate in reactions. The electrons (e) in the conduction band (CB) undergo a reduction reaction, reducing A to form A. The holes ($h^+$) in the valence band (VB) undergo an oxidation reaction to oxidize B to form $B^+$. Recombination of photo-generated electron-hole pairs (i.e. bulk recombination) and surface reaction compete with each other, which inhibits recombination of photo-generated charges, thereby improving a photon quantum efficiency of the material participating in photocatalytic reactions.

Figure 4:
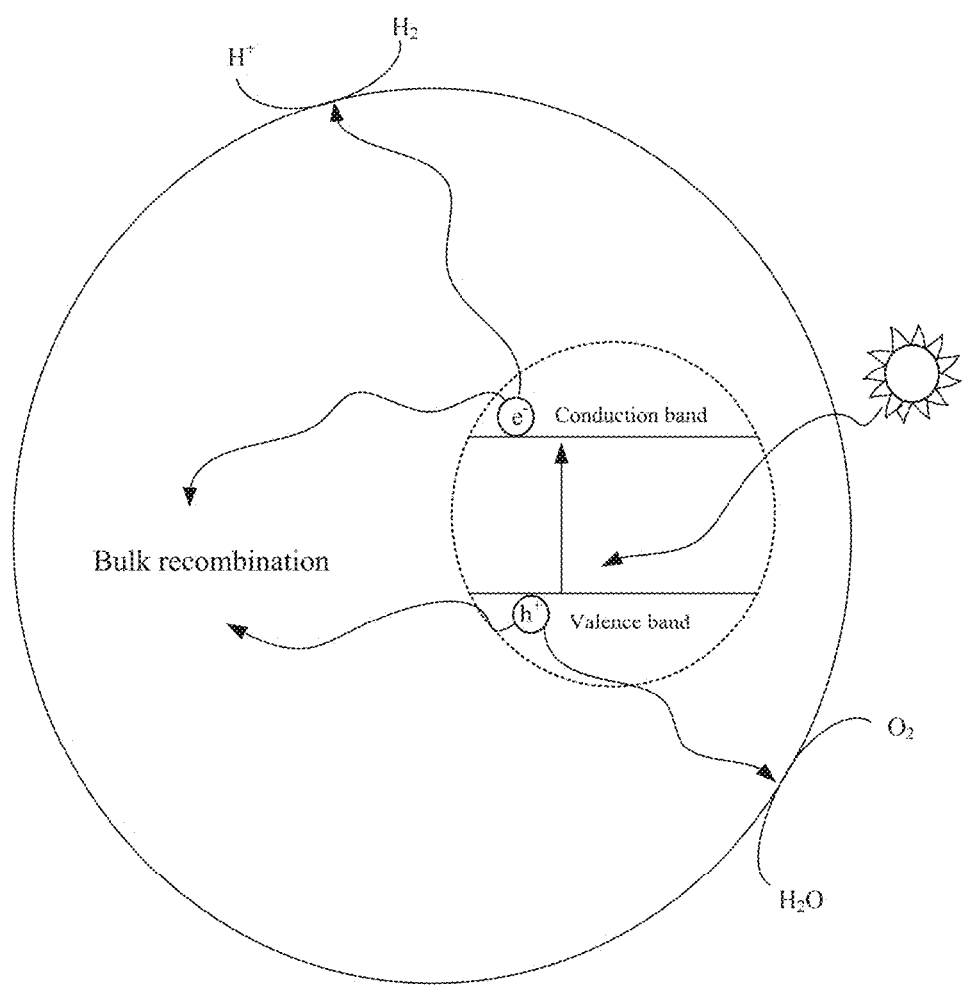
FIG. 4 is a schematic diagram of a basic principle of photocatalytic water splitting in the first photocatalytic layer in the display panel according to an embodiment of the present disclosure.
Figure 5:
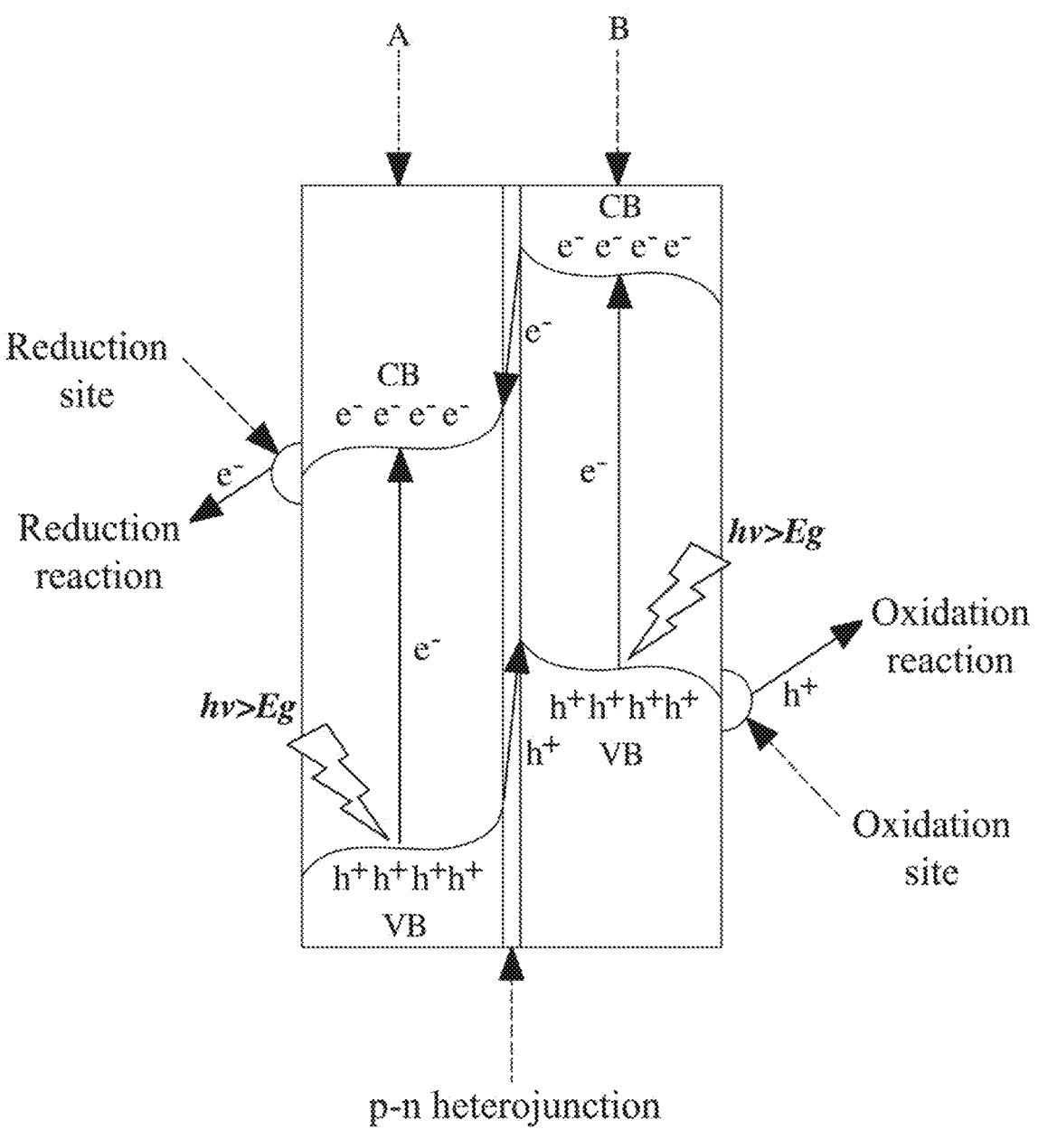
FIG. 5 is a schematic diagram of a mechanism of photocatalytic redox reaction in the first photocatalytic layer formed of materials with different band gaps in the display panel according to an embodiment of the present disclosure.
Figure 6:
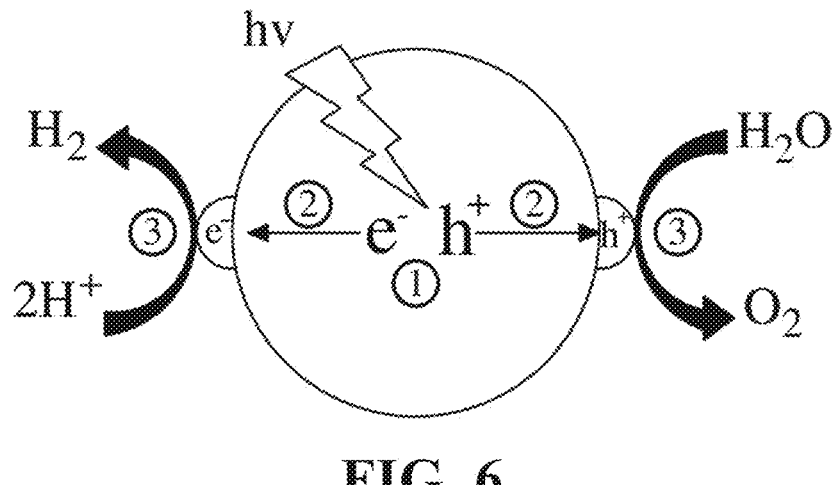
FIG. 6 is a schematic diagram of a principle of blocking free hydrogen ions and water by the first photocatalytic layer in the display panel according to an embodiment of the present disclosure.

Please refer to FIG. 4 to FIG. 6. FIG. 4 is a schematic diagram of a basic principle of photocatalytic water splitting in the first photocatalytic layer in the display panel according to an embodiment of the present disclosure. FIG. 5 is a schematic diagram of a mechanism of photocatalytic redox reaction in the first photocatalytic layer formed of materials with different band gaps in the display panel according to an embodiment of the present disclosure. FIG. 6 is a schematic diagram of a principle of blocking free hydrogen ions and water by the first photocatalytic layer in the display panel according to an embodiment of the present disclosure.

A principle and process of photocatalytic water splitting and $H^+$ reduction are as follows.

When the first material and the second material are excited by light radiation, photo-generated electron-hole pairs are generated. Some of the photo-generated electron-hole pairs are effectively separated and migrate to surfaces of the first material and the second material to participate in a redox reaction. Photo-generated electrons reduce $H^+$ to form $H_2$. Photo-generated holes oxidize $H_2O$ to $O_2$. The three main steps of photocatalytic water splitting are as follows.

Step (a): the first material and the second material absorb photons with energy greater than or equal to their band gap to generate photo-generated electron-hole pairs.

Step (b): photo-generated charges are separated and migrate to the surfaces of the first material and the second material.

Step (c): on surface active sites, holes with sufficient potential at the valence band level split water (please refer to chemical equation (1)), and electrons with sufficient potential at the conduction band level reduce $H^+$ (please refer to chemical equation (2)). Chemical equation (3) shows that the first material and the second material completely photocatalytically split water into hydrogen.

$$2H_2O + 4h^+ \rightarrow O_2(g) + 4H^+ \qquad (1)$$

$$2H^+ + 2e^- \rightarrow H_2(g) \qquad (2)$$

$$H_2O \xrightarrow{hv} H_2(g) + \frac{1}{2}O_2(g); \Delta G = 237 \text{ KJ/mol} \qquad (3)$$

In an embodiment, the first material comprises $TiO_2$ (anatase), $TiO_2$ (rutile), $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, $Mn$-$Fe_2O_3$, $Ta_2O_5$, Pt, $Ta_3N_5$, g-$C_3N_4$, $BiFeO_3$, $CoOx$-$Mo_2N$, $Ge_3N_4$, $ZnInS_4$, $Cs_2O$, $Bi_2O_3$, InSe, or $Zr_2CO_2$. The second material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, $Mn$-$Fe_2O_3$, $Ta_2O_5$, Pt, $Ta_3N_5$, g-$C_3N_4$, $BiFeO_3$, $CoOx$-$Mo_2N$, $Ge_3N_4$, $ZnInS_4$, $Cs_2O$, $Bi_2O_3$, InSe, or $Zr_2CO_2$. As an example, the first material may be NiO, and the second material may be ZnO. The first material may be $TiO_2$ (anatase), and the second material may be $TiO_2$ (rutile). The first material may be $\beta$-$Ga_2O_3$, and the second material may be $\alpha$-$Ga_2O_3$. The first material may be GaN, and the second material may be ZnO.

In an embodiment, the first photocatalytic layer 220 is made of TiO2 anatase and TiO2 rutile. Alternatively, the first photocatalytic layer 220 is made of $\alpha$-$Ga_2O_3$ and $\beta$-$Ga_2O_3$. Alternatively, the first photocatalytic layer 220 is made of GaN and ZnO. Alternatively, the first photocatalytic layer 220 is made of $Ti_3C_2$ and TiO2. Alternatively, the first photocatalytic layer 220 is made of TiO2 and CdS. Alternatively, the first photocatalytic layer 220 is made of $BiVO_4$ and $Ti_3C_2$. Alternatively, the first photocatalytic layer 220 is made of NiO and $SrTiO_3$. Alternatively, the first photocatalytic layer 220 is made of $SnO_2$ and $NiGa_2O_4$. Alternatively, the first photocatalytic layer 220 is made of $WO_3$ and $C_3N_4$. Alternatively, the first photocatalytic layer 220 is made of $Mn$-$Fe_2O_3$ and $C_3N_4$. Alternatively, the first photocatalytic layer 220 is made of $Ta_2O_5$ and $C_3N_4$. Alternatively, the first photocatalytic layer 220 is made of Pt and $Ta_3N_5$. Alternatively, the first photocatalytic layer 220 is made of NiO and g-$C_3N_4$. Alternatively, the first photocatalytic layer 220 is made of g-$C_3N_4$ and $BiFeO_3$. Alternatively, the first photocatalytic layer 220 is made of $CoOx$-$Mo_2N$ and $Ge_3N_4$. Alternatively, the first photocatalytic layer 220 is made of Pt and $ZnInS_4$. Alternatively, the first photocatalytic layer 220 is made of $Cs_2O$, $Bi_2O_3$, and ZnO. Alternatively, the first photocatalytic layer 220 is made of InSe and $Zr_2CO_2$.

It should be noted that the first material and the second material may be materials with a same chemical formula, and their energy levels may be different due to different production conditions.

It should be noted that the first photocatalytic layer 220 may also be made of three or more materials, and at least two materials of the three or more materials have different energy levels. A newly added third material comprises TiO2 (anatase), TiO2 (rutile), $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, $Mn$-$Fe_2O_3$, $Ta_2O_5$, Pt, $Ta_3N_5$, g-$C_3N_4$, $BiFeO_3$, $CoOx$-$Mo_2N$, $Ge_3N_4$, $ZnInS_4$, $Cs_2O$, $Bi_2O_3$, InSe, or $Zr_2CO_2$. In the present disclosure, the first photocatalytic layer 220 is made of three or more materials, which further improves the photocatalytic performance of the first photocatalytic layer 220, thereby further improving the performance of the first photocatalytic layer 220 to block penetration of hydrogen ions and water into the oxide active layer 210. As an example, the first photocatalytic layer 220 further comprises the third material, a fourth material, a fifth material, and the like.

Figure 7:
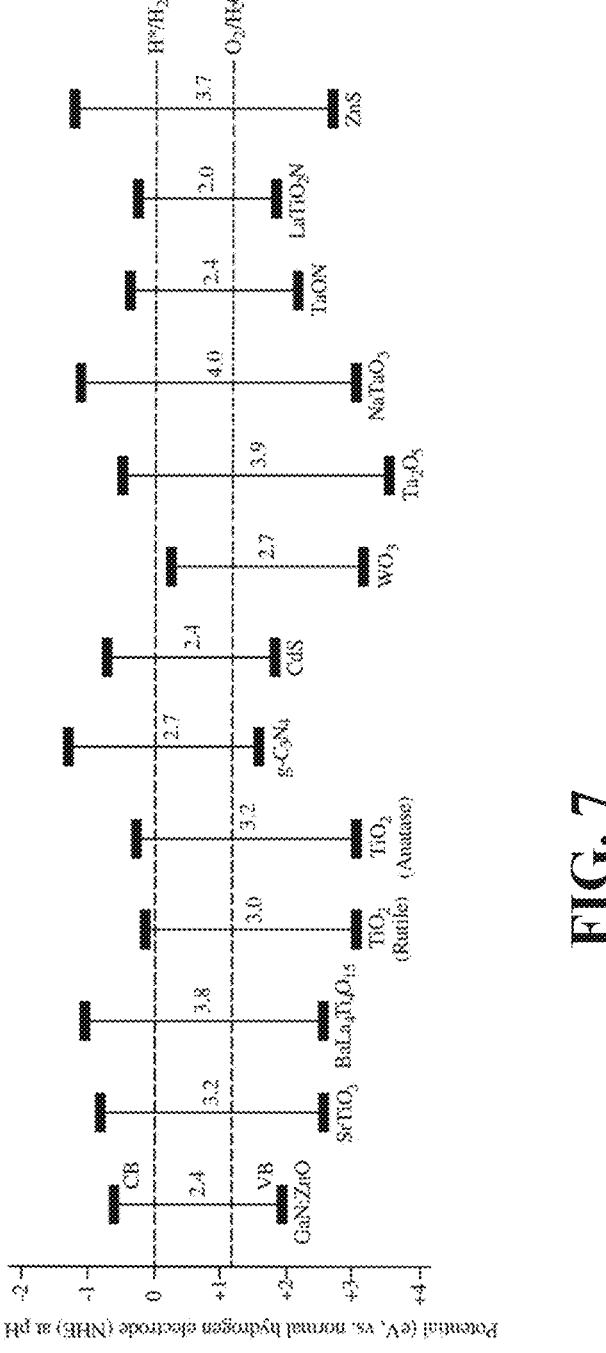
FIG. 7 is a schematic diagram showing energy levels and redox potentials of water splitting of various materials of the first photocatalytic layer in the display panel according to an embodiment of the present disclosure.

Please refer to FIG. 7, which is a schematic diagram showing energy levels and redox potentials of water splitting of various materials of the first photocatalytic layer 220 in the display panel 10 according to an embodiment of the present disclosure. It should be noted that only the energy levels of some compounds are shown in FIG. 7. Other compounds also have potentials to reduce hydrogen ions and split water, which is not listed herein.

Figure 8:
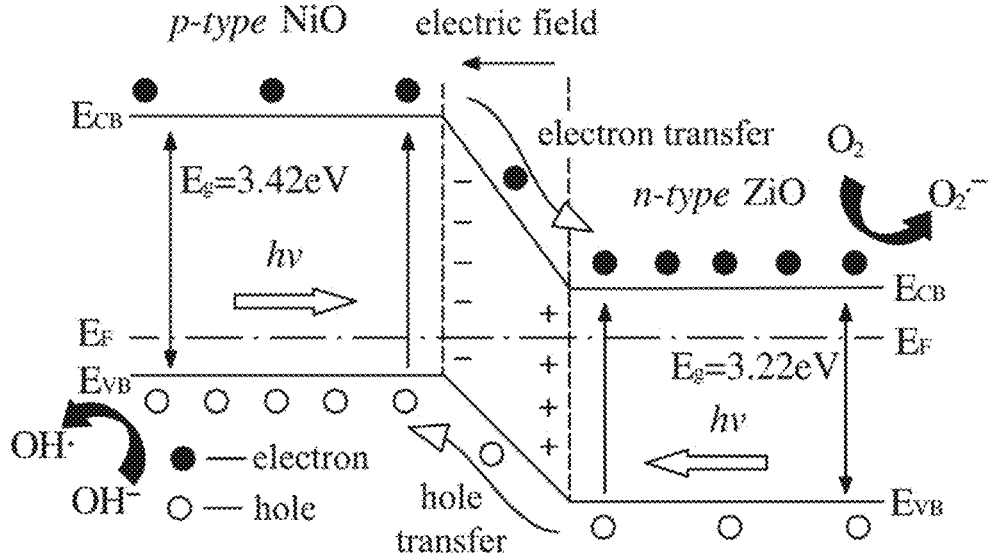
FIG. 8 is a schematic diagram of an energy level structure of p-type NiO/n-type ZnO and photo-generated charge separation in the first photocatalytic layer according to an embodiment of the present disclosure.

Please refer to FIG. 8, which is a schematic diagram of an energy level structure of p-type NiO/n-type ZnO and photo-generated charge separation in the first photocatalytic layer according to an embodiment of the present disclosure. The first photocatalytic layer 220 is made of the first material being NiO and the second material being ZnO, wherein NiO is p-type and ZnO is n-type. A hole concentration of p-type NiO is higher, and a free electron concentration of n-type ZnO is higher. Therefore, electrons are transferred from n-type ZnO to p-type NiO, so an n-type ZnO side of a heterojunction is positively charged. Holes are transferred from p-type NiO to n-type ZnO, so a p-type NiO side of the heterojunction is negatively charged. Accordingly, a built-in electric field is formed at an interface of the p-n heterojunction. A contact interface between p-type NiO and n-type ZnO forms an internal electric field due to transfer of electrons and holes. When a p-NiO/n-ZnO heterojunction system is excited by photons with energy greater than or equal to its band gap, photo-generated electron-hole pairs can be efficiently separated and rapidly migrated by a built-in electric field in a space charge region of the contact interface. Photo-generated electrons are transferred from a conduction band of p-type NiO to a conduction band of n-type ZnO, and photo-generated holes are rapidly transferred from a valence band of n-type ZnO to a valence band of p-type NiO, so that the photo-generated electron-hole pairs are efficiently separated in space. This improves the performance of the first photocatalytic layer 220 to split water and reduce hydrogen ions, thereby improving the performance of the first photocatalytic layer 220 to block water and hydrogen ions from eroding the oxide active layer 210, and improving the performance of the display panel 10.

Figure 9:
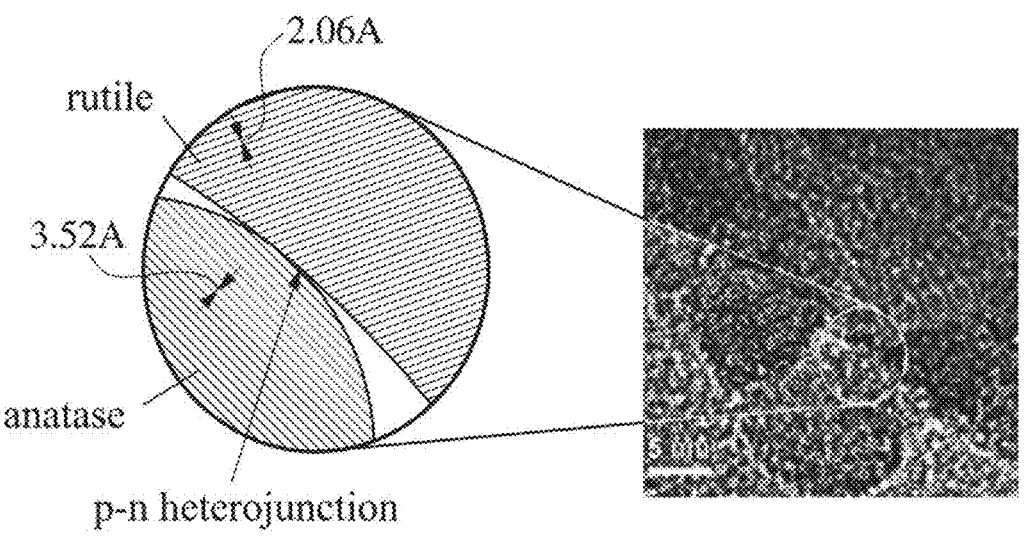
FIG. 9 is a transmission electron microscope diagram and a schematic diagram of a $TiO_2$ (anatase)/$TiO_2$ (rutile) heterojunction in the first photocatalytic layer according to an embodiment of the present disclosure.
Figure 10:
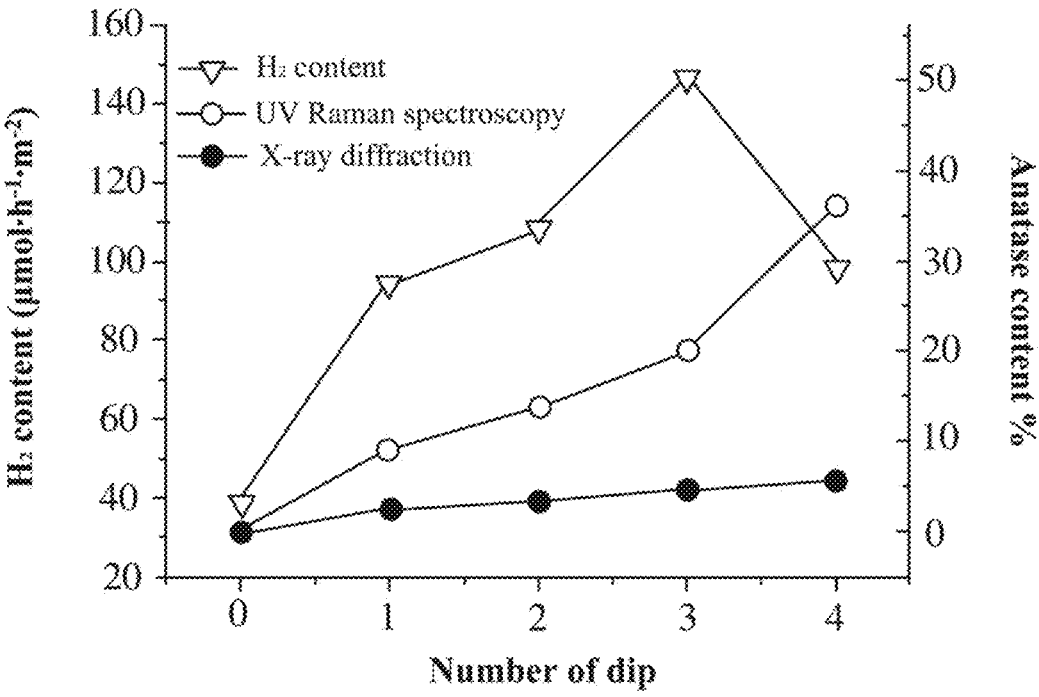
FIG. 10 is a schematic diagram of photocatalytic water splitting by TiO2 (anatase)/TiO2 (rutile) in the first photocatalytic layer according to an embodiment of the present disclosure.

Please refer to FIG. 9 and FIG. 10. FIG. 9 is a transmission electron microscope diagram and a schematic diagram of a TiO2 (anatase)/TiO2 (rutile) heterojunction in the first photocatalytic layer according to an embodiment of the present disclosure. FIG. 10 is a schematic diagram of photocatalytic water splitting by TiO2 (anatase)/TiO2

(rutile) in the first photocatalytic layer according to an embodiment of the present disclosure.

The first material is TiO2 (anatase), and the second material is TiO2 (rutile). In the present disclosure, As the number of TiO2 (anatase) on a surface of TiO2 (rutile) increases, a photocatalytic activity for hydrogen evolution per surface area of TiO2 (anatase)/TiO2 (rutile) increases. A rate of $H_2$ evolution per surface area of TiO2 (rutile) prior to an addition of TiO2 (anatase) is used as a benchmark for comparison (the data point at 0 dip). X-ray diffraction (XRD) and UV Raman spectroscopy indicate a content of TiO2 (anatase) in a sample of TiO2 (anatase)/TiO2 (rutile).

It can be seen from the above that a photocatalytic activity of TiO2 nanoparticles is directly related to its surface structure. The surface structure can be sensitively detected by UV Raman spectroscopy. The surface structure can also be sensitively detected by transmission electron microscopy. Therefore, a phase connection between TiO2 (anatase) and TiO2 (rutile) can improve the photocatalytic activity of the first photocatalytic layer 220 That is, the performance of the first photocatalytic layer 220 to split water and reduce hydrogen ions is improved, thereby improving the performance of the first photocatalytic layer 220 to block water and hydrogen ions from eroding the oxide active layer 210, and improving the performance of the display panel 10.

Figure 11:
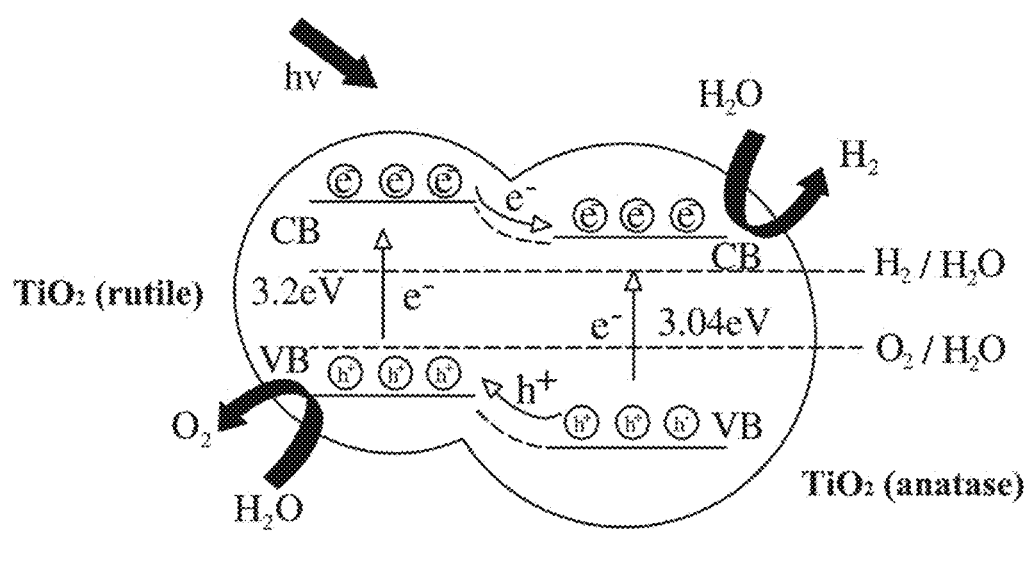
FIG. 11 is a schematic diagram of a current mechanism by which TiO2 (anatase)/TiO2 (rutile) in the first photocatalytic layer according to an embodiment of the present disclosure complete splits water into hydrogen.
Figure 12:
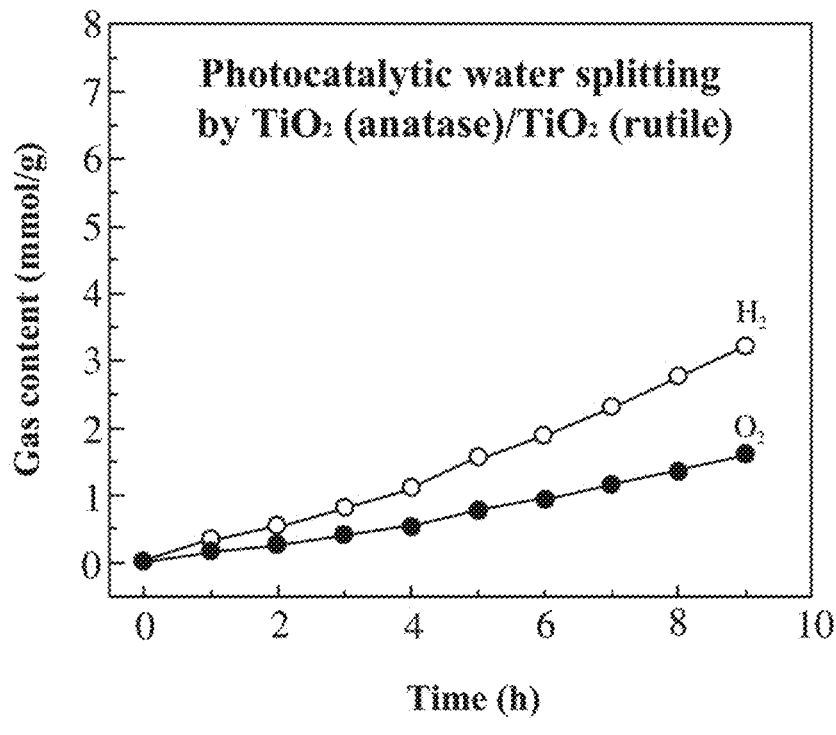
FIG. 12 is a schematic diagram of water splitting by TiO2 (anatase)/TiO2 (rutile) in the first photocatalytic layer according to an embodiment of the present disclosure.

Please refer to FIG. 11 and FIG. 12. FIG. 11 is a schematic diagram of a current mechanism by which $TiO_2$ (anatase)/$TiO_2$ (rutile) in the first photocatalytic layer according to an embodiment of the present disclosure complete splits water into hydrogen. FIG. 12 is a schematic diagram of water splitting by $TiO_2$ (anatase)/$TiO_2$ (rutile) in the first photocatalytic layer according to an embodiment of the present disclosure.

It can be seen that when the first photocatalytic layer 220 made of TiO2 (anatase)/TiO2 (rutile) splits water, a content of obtained $O_2$ can reach up to 1.5 mmol/g, and a content of obtained $H_2$ can reach up to 3.2 mmol/g.

Figure 13:
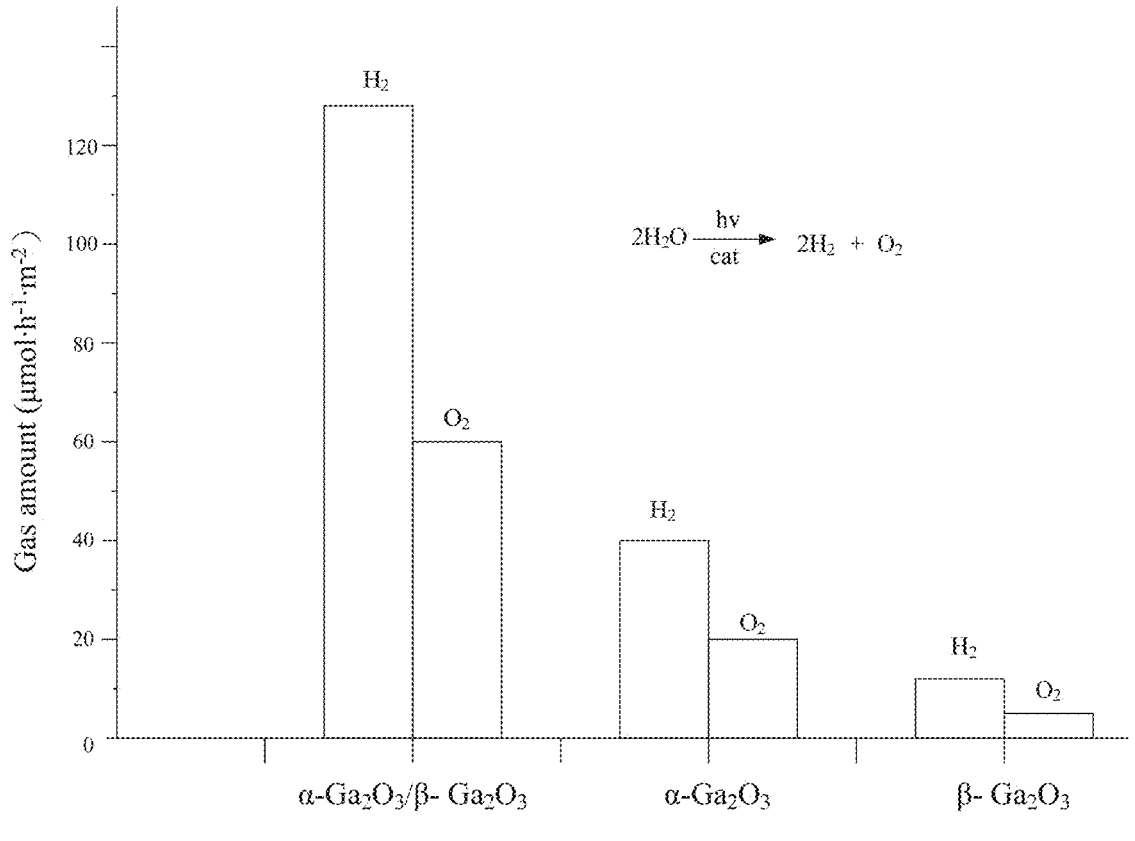
FIG. 13 is a schematic diagram showing photocatalytic water splitting of $\alpha$-$Ga_2O_3$/$\beta$-$Ga_2O_3$ in the first photocatalytic layer according to an embodiment of the present disclosure, and showing photocatalytic water splitting of a photocatalytic layer made of $\alpha$-$Ga_2O_3$ and a photocatalytic layer made of $\beta$-$Ga_2O_3$ in the prior art.

Please refer to FIG. 13, which is a schematic diagram showing photocatalytic water splitting of $\alpha$-$Ga_2O_3$/$\beta$-$Ga_2O_3$ in the first photocatalytic layer according to an embodiment of the present disclosure, and showing photocatalytic water splitting of a photocatalytic layer made of $\alpha$-$Ga_2O_3$ and a photocatalytic layer made of $\beta$-$Ga_2O_3$ in the prior art. The first material may be $\beta$-$Ga_2O_3$, and the second material may be $\alpha$-$Ga_2O_3$. In the prior art, when one photocatalytic layer is only made of $\beta$-$Ga_2O_3$, a content of obtained $H_2$ is only up to 8 $\mu$mol·h$^{-1}$·m$^2$, and a content of obtained $O_2$ is only up to 11 $\mu$mol·h$^{-1}$·m$^2$. In the prior art, when one photocatalytic layer is only made of $\alpha$-$Ga_2O_3$, a content of obtained $H_2$ is only up to 38 $\mu$mol·h$^{-1}$·m$^2$, and a content of obtained $O_2$ is only up to 21 $\mu$mol·h$^{-1}$·m$^2$. In the present disclosure, the first photocatalytic layer 220 is made of $\alpha$-$Ga_2O_3$ and $\beta$-$Ga_2O_3$, a content of obtained $H_2$ can reach up to 130 $\mu$mol·h$^{-1}$·m$^2$, and a content of obtained $O_2$ can reach up to 60 $\mu$mol·h$^{-1}$·m$^2$. It can be seen from the above that using at least two materials with different conduction band energy levels or valence band energy levels to form the first photocatalytic layer 220 can improve the performance of the first photocatalytic layer 220 to split water and reduce hydrogen ions, thereby improving the performance of the first photocatalytic layer 220 to block water and hydrogen ions from eroding the oxide active layer 210, and improving the performance of the display panel 10.

Figure 14:
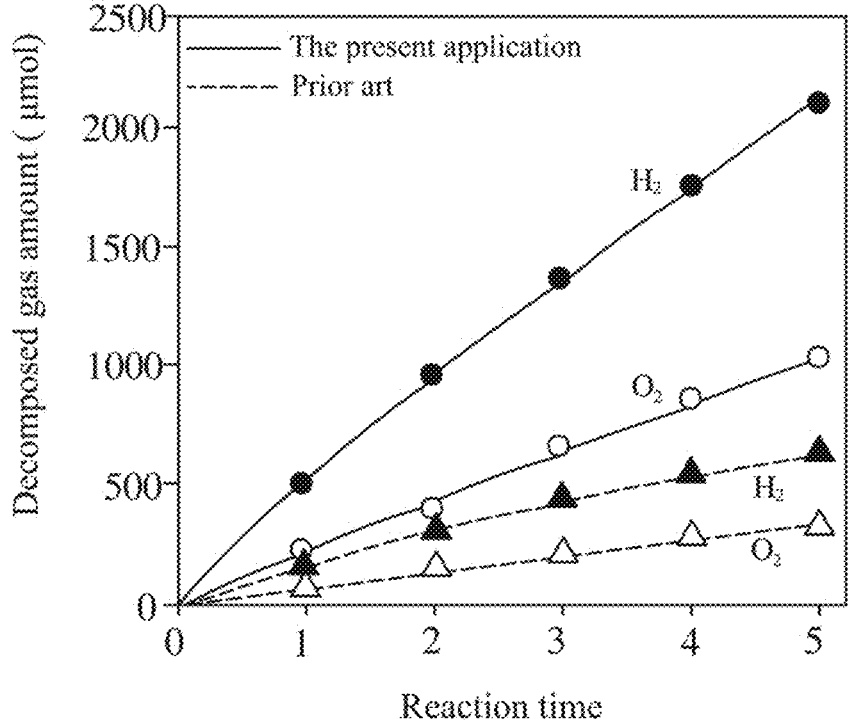
FIG. 14 is a schematic diagram showing photocatalytic water splitting of GaN/ZnO in the first photocatalytic layer according to an embodiment of the present disclosure, and showing photocatalytic water splitting of a photocatalytic layer made of GaN and a photocatalytic layer made of ZnO in the prior art.

Please refer to FIG. 14, which is a schematic diagram showing photocatalytic water splitting of GaN/ZnO in the first photocatalytic layer according to an embodiment of the present disclosure, and showing photocatalytic water splitting of a photocatalytic layer made of GaN and a photocatalytic layer made of ZnO in the prior art.

The first material may be GaN, and the second material may be ZnO. In the prior art, when one photocatalytic layer is only made of GaN or ZnO, a content of obtained $H_2$ is only up to 500 $\mu$mol, and a content of obtained $O_2$ is only up to 250 $\mu$mol. In the present disclosure, the first photocatalytic layer 220 is made of GaN and ZnO, a content of obtained $H_2$ can reach up to 2100 $\mu$mol, and a content of obtained $O_2$ can reach up to 1000 $\mu$mol. It can be seen from the above that using at least two materials with different conduction band energy levels or valence band energy levels to form the first photocatalytic layer 220 can improve the performance of the first photocatalytic layer 220 to split water and reduce hydrogen ions, thereby improving the performance of the first photocatalytic layer 220 to block water and hydrogen ions from eroding the oxide active layer 210, and improving the performance of the display panel 10.

Figure 15:
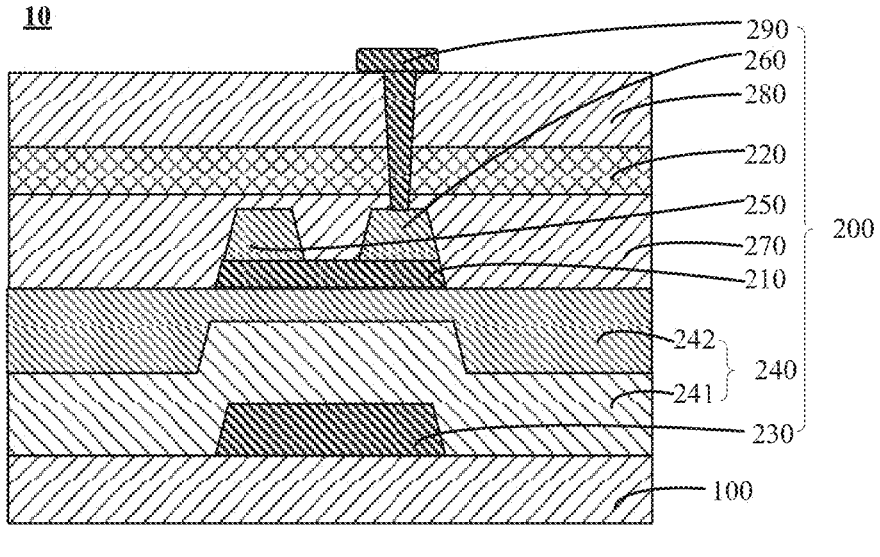
FIG. 15 is a schematic diagram of a second structure of display panel according to an embodiment of the present disclosure.

Please refer to FIG. 15, which is a schematic diagram of a second structure of display panel according to an embodiment of the present disclosure.

It should be noted that the second structure differs from the first structure in that the insulating layer 240 comprises a first sublayer 241 and a second sublayer 242. The first sublayer 241 is disposed on the substrate 100 and the gate electrode 230. The second sublayer 242 is disposed on the first sublayer 241. The oxide active layer 210 is disposed on the second sublayer 242. The first sublayer 241 is made of silicon nitride. The second sublayer 242 is made of one or more of aluminum oxide and silicon oxide. The insulating layer 240 is a gate insulating layer.

Figure 16:
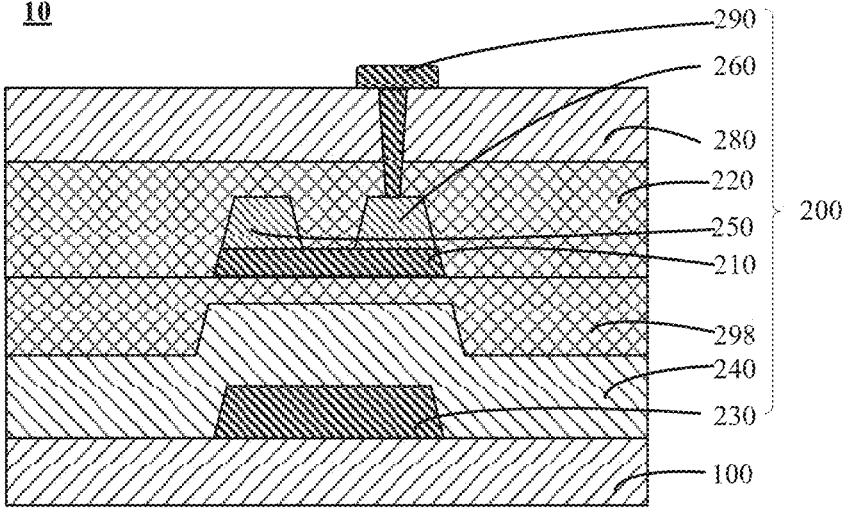
FIG. 16 is a schematic diagram of a third structure of display panel according to an embodiment of the present disclosure.

Please refer to FIG. 16, which is a schematic diagram of a third structure of display panel according to an embodiment of the present disclosure. It should be noted that the third structure differs from the first structure in that the display panel 10 further comprises a second photocatalytic layer 298, the oxide active layer 210 is disposed on the second photocatalytic layer 298, and the first photocatalytic layer 220 is disposed on the oxide active layer 210. Specifically, the second sublayer 242 of FIG. 13 is replaced with the second photocatalytic layer 298 made of at least two materials with different valence band energy levels or conduction band energy levels, the first passivation layer 270 of FIG. 13 is removed, and the first photocatalytic layer 220 of FIG. 13 is disposed at an original position of the first passivation layer 270. That is, one gate insulating layer is composed of the second photocatalytic layer 298 and the insulating layer 240, and one passivation layer is composed of the second passivation layer 280 and the first photocatalytic layer 220.

It should be noted that materials and functions of the second photocatalytic layer 298 are same as those of the first photocatalytic layer 220, but their positions are different, which will not be described in detail herein.

In the present disclosure, photocatalytic layers is disposed both above and below the oxide active layer 210, so as to further improve the performance of the first photocatalytic layer 220 to split water and reduce hydrogen ions, thereby further improving the performance of the first photocatalytic layer 220 to block water and hydrogen ions from eroding the oxide active layer 210, and further improving the performance of the display panel 10.

Figure 17:
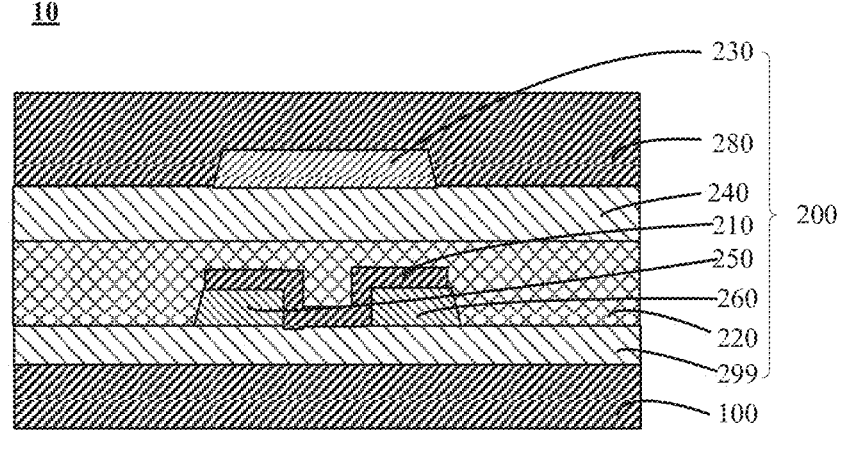
FIG. 17 is a schematic diagram of a fourth structure of display panel according to an embodiment of the present disclosure.

Please refer to FIG. 17, which is a schematic diagram of a fourth structure of display panel according to an embodiment of the present disclosure. It should be noted that the fourth structure differs from the first structure in that the transistor is a top-gate transistor, and the transistor layer 200 further comprises a buffer layer 299. The buffer layer 299 is disposed on the substrate 100. The source electrode 250 and the drain electrode 260 are disposed in a same layer and are disposed on the buffer layer 299 at intervals. The oxide active layer 210 is disposed on the substrate 100, the source electrode 250, and the drain electrode 260. The first photocatalytic layer 220 is disposed on the oxide active layer 210 and the substrate 100. The insulating layer 240 is disposed on the first photocatalytic layer 220. The gate electrode 230 is disposed on the insulating layer 240. The gate electrode 230 is located above the oxide active layer 210. That is, the first photocatalytic layer 220 and the insulating layer 240 constitute one gate insulating layer.

Figure 18:
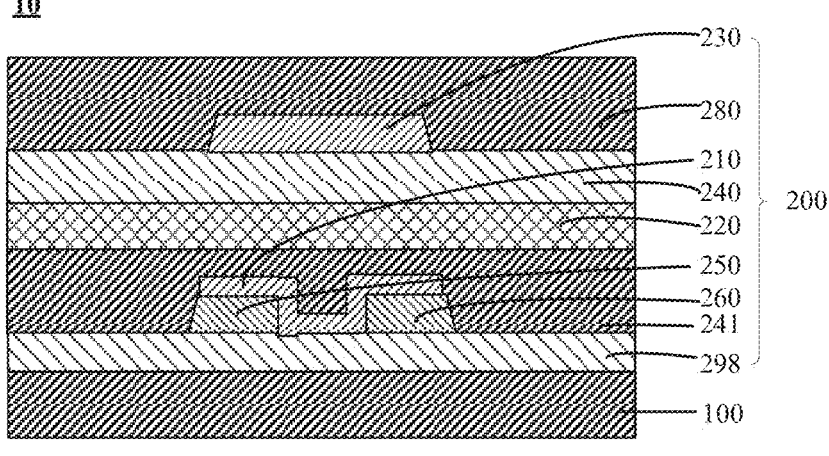
FIG. 18 is a schematic diagram of a fifth structure of display panel according to an embodiment of the present disclosure.

Please refer to FIG. 18, which is a schematic diagram of a fifth structure of display panel according to an embodiment of the present disclosure. It should be noted that the fifth structure differs from the fourth structure in that an additional layer 241 is disposed between the first photocatalytic layer 220 and the oxide active layer 210. The additional layer 241 is made of silicon oxide. The additional layer 241, the first photocatalytic layer 220, and the insulating layer 240 constitute one gate insulating layer.

The present disclosure further provides a method for fabricating a display panel, which comprises the following steps.

B11: providing a substrate.

B12: forming a first photocatalytic layer on the substrate and forming an oxide active layer on the first photo-catalytic layer, or forming the oxide active layer on the substrate and forming the first photocatalytic layer on the oxide active layer. The first photocatalytic layer is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV.

In the present disclosure, at least two materials with different energy levels are used to form the first photocata-lytic layer, and at least one of the conduction band energy level of the first material and the conduction band energy level of the second material is less than 0 eV, which improves a performance of the first photocatalytic layer to block hydrogen ions, thereby preventing hydrogen ions from penetrating into the oxide active layer and improving a performance of the display panel.

Figure 19:
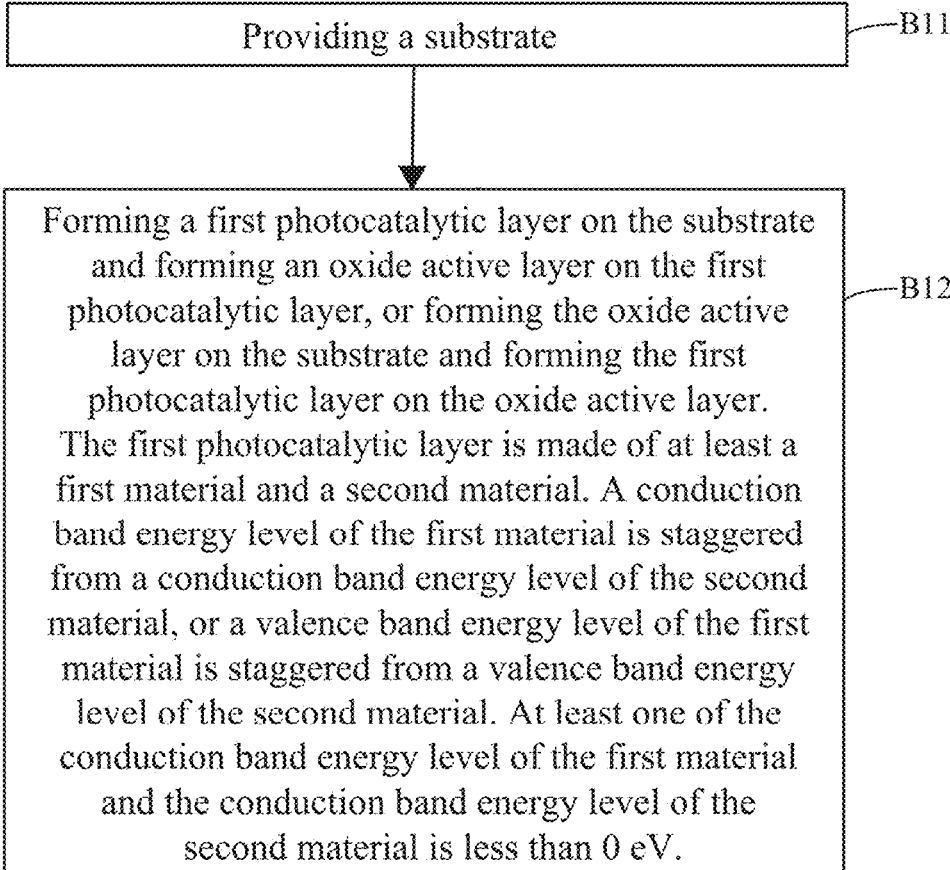
FIG. 19 is a schematic flowchart of a method for fabricating a display panel according to an embodiment of the present disclosure.

Please refer to FIG. 19, which is a schematic flowchart of a method for fabricating a display panel according to an embodiment of the present disclosure. The present disclo-sure further provides a method for fabricating a display panel, which comprises the following steps.

B11: providing a substrate.

Please refer to FIG. 1. Specifically, a gate electrode 230 is formed on a substrate 100, and then an insulating layer 240 is formed on the gate electrode 230 and the substrate 100. Then, an oxide active layer 210 is formed on the insulating layer 240, and then a source electrode 250 and a drain electrode 260 are formed on the oxide active layer 210 in a same layer and spaced apart.

B12: forming a first photocatalytic layer on the substrate and forming an oxide active layer on the first photo-catalytic layer, or forming the oxide active layer on the substrate and forming the first photocatalytic layer on the oxide active layer. The first photocatalytic layer is made of at least a first material and a second material. A conduction band energy level of the first material is staggered from a conduction band energy level of the second material, or a valence band energy level of the first material is staggered from a valence band energy level of the second material. At least one of the con-duction band energy level of the first material and the conduction band energy level of the second material is less than 0 eV.

Specifically, a first passivation layer 270 is formed on the insulating layer 240, the source electrode 250, and the drain electrode 260. Then, a first material and a second material are deposited on the first passivation layer 270 by chemical or physical vapor deposition using a mask of the first passivation layer 270 to form ta first photocatalytic layer 220. At least one of a conduction band energy level of the first material and a conduction band energy level of the second material is less than 0 eV, −0.2 eV, −1 eV,−1.5 eV, −2 eV, −2.5 eV, −3 eV, or the like. Then, a second passivation layer 280 is formed on the first passivation layer 270.

In the present disclosure, at least two materials with different valence band energy levels (VB) or conduction band energy levels (CB) are used to form the first photo-catalytic layer 220, and at least one of the conduction band energy level (CB) of the first material and the conduction band energy level (CB) of the second material is set to be less than 0 eV, so that two or more materials with different valence band energy levels (VB) are in contact with each other to form a heterojunction layer, or two or more mate-rials with different conduction band energy levels (CB) are in contact with each other to form a heterojunction layer. Therefore, the first photocatalytic layer 220 has high charge separation capability, high charge mobility, and long-lived photo-generated carriers under pure illumination conditions, and achieves local separation of incompatible oxidation and reduction reactions in a nanoscale space. This improves a photocatalytic performance of the first photocatalytic layer 220. That is, the first photocatalytic layer 220 is formed of at least two materials with different valence band energy levels (VB) or conduction band energy levels (CB), so as to improve generation of efficient photo-generated electron-hole pairs (i.e. carriers) by the first photocatalytic layer 220 under pure illumination conditions, thereby improving a performance of the first photocatalytic layer 220 to reduce hydrogen ions. This improves a performance of the first photocatalytic layer 220 to block penetration of hydrogen ions into the oxide active layer 210, thereby improving a performance of the display panel 10.

In an embodiment, at least one of a band gap of the first material and a band gap of the second material is greater than 1.23 eV. Specifically, at least one of the band gap of the first material and the band gap of the second material may be greater than 1.23 eV, 2.4 eV, 2.7 eV, 3 eV, 3.2 eV, 3.8 eV, 4.5 eV, 9 eV, or the like.

In the present disclosure, at least one of the band gap of the first material and the band gap of the second material is set to be greater than 1.23 eV, so as to further improve a performance of the first photocatalytic layer 220 for water splitting, thereby further improving a performance of the first photocatalytic layer 220 in blocking water to erode the oxide active layer 210, and further improving the perfor-mance of the display panel 10.

In an embodiment, at least one of the band gap of the first material and the band gap of the second material is greater than 1.8 eV. Specifically, at least one of the band gap of the first material and the band gap of the second material may be greater than 1.8 eV, 2.4 eV, 2.7 eV, 3 eV, 3.2 eV, 3.8 eV, 5 eV, 8 eV, 9 eV, 12 eV, 20 eV, or the like.

In the present disclosure, at least one of the band gap of the first material and the band gap of the second material is set to be greater than 1.8 eV, so as to prevent overvoltage from affecting photocatalytic reaction, which further improves a performance of the first photocatalytic layer 220 for water splitting, thereby further improving a performance of the first photocatalytic layer 220 in blocking water to erode the oxide active layer 210, and further improving the performance of the display panel 10.

In an embodiment, the first material comprises $TiO_2$ (anatase), $TiO_2$ (rutile), $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, $Mn$-$Fe_2O_3$, $Ta_2O_5$, Pt, $Ta_3N_5$, g-$C_3N_4$, $BiFeO_3$, $CoOx$-$Mo_2N$, $Ge_3N_4$, $ZnInS_4$, $Cs_2O$, $Bi_2O_3$, InSe, or $Zr_2CO_2$. The second material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, $Mn$-$Fe_2O_3$, $Ta_2O_5$, Pt, $Ta_3N_5$, g-$C_3N_4$, $BiFeO_3$, $CoOx$-$Mo_2N$, $Ge_3N_4$, $ZnInS_4$, $Cs_2O$, $Bi_2O_3$, InSe, or $Zr_2CO_2$. As an example, the first material may be NiO, and the second material may be ZnO. The first material may be $TiO_2$ (anatase), and the second material may be $TiO_2$ (rutile). The first material may be $\beta$-$Ga_2O_3$, and the second material may be $\alpha$-$Ga_2O_3$. The first material may be GaN, and the second material may be ZnO.

As an example, methods for fabricating the first photocatalytic layer 220 are as follows.

Method 1: a method for fabricating one first photocatalytic layer 220 formed by lamination of TiO2 (anatase)/TiO2 (rutile), which comprises the following steps.

Step (1): forming a TiO2 (anatase) layer. On the first passivation layer 270, tetradimethylamino titanium is brought into a reactor with pure $N_2$ as a carrier gas. Ti—(N—$(CH_3)_2)_4$ (tetradimethylamino titanium) is used as a metal organic compound source of Ti, and pure $O_2$ is used as an oxidant. Then, an annealing temperature is set to 400° C.-600° C., and annealing is performed to obtain the TiO2 (anatase) layer.

In an embodiment, titanium tetradimethylamino may be replaced with isopropyl titanate.

In an embodiment, He, Ne, Ar, or Kr may replace $N_2$ as the carrier gas.

In an embodiment, the annealing temperature may be 400° C., 500° C., 520° C., 530° C., or 600° C. The annealing temperature is set to 400° C.-600° C. to ensure stability of a crystal form of TiO2 (anatase) and to remove residual organic matter.

Step (2): forming a TiO2 (rutile) layer, which may be one of the following steps.

Step a: $Ti(OC_4H_9)_4$ as metal organic compound source is heated to 120° C., and then $Ti(OC_4H_9)_4$ is brought into the reactor with $N_2$ as a carrier gas, and a certain amount of $O_2$ is introduced into the reactor, and then the TiO2 (rutile) layer is formed at a reaction temperature of 600° C.

Step b: a TiO2 target is sputtered onto the substrate for coating, and then the substrate is heated to 600° C. to convert a part of the TiO2 (anatase) layer into the TiO2 (rutile) layer.

In an embodiment, a reaction temperature for forming the $TiO_2$ (rutile) layer is 600° C.-800° C. Specifically, the reaction temperature for forming the $TiO_2$ (rutile) layer may be 500° C., 600° C., 700° C., or 800° C. When the reaction temperature reaches 600° C., $TiO_2$ (rutile) begins to form. If the reaction temperature is too low, a formation rate of $TiO_2$ (rutile) will be slow, which is beneficial to control a ratio of $TiO_2$ (rutile) by time.

Method 2: a method for fabricating one first photocatalytic layer 220 formed by lamination of $\alpha$-$Ga_2O_3$/$\beta$-$Ga_2O_3$, which comprises forming an $\alpha$-$Ga_2O_3$ layer, and then forming a $\beta$-$Ga_2O_3$ layer.

Step (1): forming an $\alpha$-$Ga_2O_3$ layer, which comprises: coating $Ga(NO_3)_3$ with a concentration of 0.075 mol/L and hexamethylenetetramine with a concentration of 0.05 mol/L on a surface of the substrate, and annealing them at a temperature of 500° C.-600° C. to obtain the $\alpha$-$Ga_2O_3$ layer.

In an embodiment, an annealing temperature may be 500° C., 556° C., 580° C., or 600° C. The annealing temperature is set to 500-600° C. to make $Ga_2O_3$ form $\alpha$-$Ga_2O_3$. If the annealing temperature is higher than 600° C., particles of the $\alpha$-$Ga_2O_3$ layer will become larger and a permeability of the $\alpha$-$Ga_2O_3$ layer will be affected. If the annealing temperature is lower than 500° C., $Ga_2O_3$ cannot be converted into $\alpha$-$Ga_2O_3$, thereby affecting a performance of the first photocatalytic layer 220 to block hydrogen ions and water, and affecting a performance of the display panel.

Step (1): forming a $\beta$-$Ga_2O_3$ layer. In a vacuum chamber at room temperature, a flow rate of $O_2$ is set to 5 sccm, and a pressure inside the vacuum chamber is set to 1 Pa. A $Ga_2O_3$ thin film is formed by magnetron sputtering pure a $Ga_2O_3$ target. The $\beta$-$Ga_2O_3$ layer is formed from the $Ga_2O_3$ thin film at an annealing temperature of 600° C. and an annealing time of 2 hours.

In an embodiment, the annealing temperature is 500-600° C. Specifically, the annealing temperature may be 500° C., 556° C., 580° C., or 600° C. The annealing temperature is set to 500-600° C. to make $Ga_2O_3$ form $\beta$-$Ga_2O_3$. If the annealing temperature is higher than 600° C., particles of the $\beta$-$Ga_2O_3$ layer will become larger and a permeability of the $\beta$-$Ga_2O_3$ layer will be affected. If the annealing temperature is lower than 500° C., $Ga_2O_3$ cannot be converted into $\beta$-$Ga_2O_3$, thereby affecting the performance of the first photocatalytic layer 220 to block hydrogen ions and water, and affecting the performance of the display panel.

Method 3: a method for fabricating one first photocatalytic layer 220 formed of GaN/ZnO, which may be one of the following methods.

Method 31: a method for fabricating a GaN/ZnO heterojunction double-layer, which comprises the following steps.

Step (1): forming a GaN layer, which may be one of the following steps.

Step a: a pure GaN target is bombarded with Ar plasma, and the GaN layer is obtained by magnetron sputtering.

In an embodiment, Ar may be replaced by He, Ne, Ar, or Kr as a carrier gas.

Step b: by electron cyclotron resonance-plasma enhanced chemical vapor deposition (ECR-PECVD), trimethylgallium and $N_2$ are decomposed at a decomposition temperature of 400° C.-600° C., and deposited on the substrate at a room temperature to obtain the GaN layer.

In an embodiment, the decomposition temperature is 400° C.-600° C. Specifically, the decomposition temperature is 400° C., 500° C., 550° C., 600° C., or the like. The decomposition temperature is set to 400° C.-600° C., which improves a manufacturing efficiency of the first photocatalytic layer 220, shortens a production cycle of the first photocatalytic layer 220, and improves a quality of the first photocatalytic layer 220. If the decomposition temperature is less than 400° C., decomposition efficiencies of trimethylgallium and N2 will be low. If the decomposition temperature is greater than 600° C., decomposition will be too fast, resulting in a fast film deposition rate, thereby making a film rough and low in permeability.

Step (1): forming a ZnO layer, which may be one of the following steps.

Step a: a pure ZnO target is bombarded with Ar and $O_2$ plasma, and the ZnO layer is obtained by magnetron sputtering.

Step b: by laser pulse deposition, a ZnO target is heated by laser to evaporate, and is deposited on the substrate with a surface temperature of 200-400° C. under an oxygen partial pressure of 1 m Torr to form the ZnO layer.

In an embodiment, the surface temperature of the substrate may be 200° C., 300° C., 350° C., 400° C., or the like. Setting the surface temperature of the substrate to 200° C.-400° C. can improve the quality of the first photocatalytic layer 220. If the surface temperature of the substrate is less than 200° C., the ZnO layer may be cracked.

Method 32: a method for fabricating one first photocatalytic layer 220 formed of a mixture of GaN/ZnO, which comprises the following steps.

A homogeneous mixture of GaN and ZnO powders is pressed into a target. The target is bombarded with Ar and $O_2$ plasma, and the first photocatalytic layer 220 of a GaN/ZnO mixed monolayer is obtained by magnetron sputtering.

The present disclosure provides a display panel 10 and a method for fabricating the same. The display panel 10 comprises a substrate 100 and a transistor layer 200. The transistor layer 200 is disposed on the substrate 100. The transistor layer 200 comprises an oxide active layer 210 and a first photocatalytic layer 220 that are stacked. The first photocatalytic layer 220 is made of at least a first material and a second material. A conduction band energy level of the first material is staggered from a conduction band energy level of the second material, or a valence band energy level of the first material is staggered from a valence band energy level of the second material. At least one of the conduction band energy level of the first material and the conduction band energy level of the second material is less than 0 eV. In the present disclosure, at least two materials with different valence band energy levels (VB) or conduction band energy levels (CB) are used to form the first photocatalytic layer 220, and at least one of the conduction band energy level (CB) of the first material and the conduction band energy level (CB) of the second material is set to be less than 0 eV, so that two or more materials with different valence band energy levels (VB) are in contact with each other to form a heterojunction layer, or two or more materials with different conduction band energy levels (CB) are in contact with each other to form a heterojunction layer. Therefore, the first photocatalytic layer 220 has high charge separation capability, high charge mobility, and long-lived photo-generated carriers under pure illumination conditions, and achieves local separation of incompatible oxidation and reduction reactions in a nanoscale space. This enables the first photocatalytic layer 220 to have high photocatalytic performance. That is, the first photocatalytic layer 220 is formed of at least two materials with different valence band energy levels (VB) or conduction band energy levels (CB), so as to improve generation of efficient photo-generated electron-hole pairs (i.e. carriers) by the first photocatalytic layer 220 under pure illumination conditions, thereby improving a performance of the first photocatalytic layer 220 to reduce hydrogen ions. This improves a performance of the first photocatalytic layer 220 to block penetration of hydrogen ions into the oxide active layer 210, thereby improving a performance of the display panel 10.

The display panel and the method for fabricating the same provided by the embodiments of the present disclosure are described in detail above. The present disclosure uses specific examples to describe principles and embodiments of the present application. The above description of the embodiments is only for helping to understand the technical solutions of the present disclosure and its core ideas. Furthermore, those skilled in the art may make modifications to the specific embodiments and applications according to ideas of the present invention. In conclusion, the present specification should not be construed as a limitation to the present invention.

What is claimed is:

1. A display panel, comprising:

a substrate; and a transistor layer disposed on the substrate and comprising an oxide active layer and a first photocatalytic layer that are stacked, wherein the first photocatalytic layer and the oxide active layer are sequentially stacked on the substrate, the first photocatalytic layer is made of at least one of a first material and a second material;

wherein a conduction band energy level of the first material is staggered from a conduction band energy level of the second material, or a valence band energy level of the first material is staggered from a valence band energy level of the second material;

wherein at least one of the conduction band energy level of the first material and the conduction band energy level of the second material is less than 0 eV; and wherein the transistor layer further comprises:

a gate electrode disposed on the substrate;

an insulating layer disposed on the substrate and the gate electrode, wherein the oxide active layer is disposed on the insulating layer and is disposed corresponding to the gate electrode;

a source electrode and a drain electrode disposed in a same layer and disposed on the oxide active layer at intervals;

a first passivation layer disposed on the insulating layer, the oxide active layer, the source electrode, and the drain electrode; and a second passivation layer, wherein the first photocatalytic layer and the second passivation layer are sequentially stacked on the first passivation layer.

2. The display panel according to claim 1, wherein at least one of a band gap of the first material and a band gap of the second material is greater than 1.23 eV.

3. The display panel according to claim 2, wherein at least one of the band gap of the first material and the band gap of the second material is greater than 1.8 eV.

4. The display panel according to claim 3, wherein the first material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn-$Fe_2O_3$, $Ta_2O_5$, Pt, $Ta_3Ns$, g-$C_3N_4$, $BiFeO_3$, $CoOx$-$MO_2N$, $Ge_3N_4$, $ZnInS_4$, $Cs_2O$, $Bi_2O_3$, InSe, or $Zr_2CO_2$, and the second material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn-$Fe_2O_3$, $Ta_2O_5$, Pt, $Ta_3N_5$, g-$C_3N_4$, $BiFeO_3$, $CoOx$-$MO_2N$, $Ge_3N_4$, $ZnInS_4$, $Cs_2O$, $Bi_2O_3$, InSe, or $Zr_2CO_l$.

5. The display panel according to claim 1, wherein the insulating layer comprises a first sublayer and a second sublayer that are sequentially stacked on the substrate and the gate electrode, and the oxide active layer is disposed on the second sublayer.

6. The display panel according to claim 5, wherein the first sublayer is made of silicon nitride, and the second sublayer is made of one or more of aluminum oxide and silicon oxide.

7. The display panel according to claim 1, further comprising a second photocatalytic layer disposed between the oxide active layer and the insulating layer.

8. The display panel according to claim 1, wherein the transistor layer further comprises:

a source electrode and a drain electrode disposed in a same layer and disposed on the substrate at intervals, wherein the oxide active layer is disposed on the substrate, the source electrode, and the drain electrode, and the first photocatalytic layer is disposed on the oxide active layer and the substrate;

an insulating layer disposed on the first photocatalytic layer; and a gate electrode disposed on the insulating layer and disposed corresponding to the oxide active layer.

9. The display panel according to claim 8, wherein the transistor layer further comprises:

a buffer layer disposed on the substrate, wherein the source electrode and the drain electrode are disposed in the same layer and disposed on the buffer layer at intervals.

10. The display panel according to claim 1, wherein the first photocatalytic layer is made of a mixture of the first material and the second material.

11. The display panel according to claim 1, wherein the first photocatalytic layer comprises a first photocatalytic sublayer and a second photocatalytic sublayer that are sequentially stacked on a side of the oxide active layer away from the substrate, the first photocatalytic sublayer is made of the first material, and the second photocatalytic layer is made of the second material.

12. The display panel according to claim 1, wherein the first material and the second material are in contact with each other to form a heterojunction layer.

13. The display panel according to claim 1, wherein the first material and the second material are materials with a same chemical formula.

14. The display panel according to claim 1, wherein at least one of the first material and the second material is a semiconductor material.

15. A method for fabricating a display panel, comprising:

providing a substrate; and forming a first photocatalytic layer on the substrate and forming an oxide active layer on the first photocatalytic layer, or forming the oxide active layer on the substrate and forming the first photocatalytic layer on the oxide active layer;

wherein the first photocatalytic layer is made of at least a first material and a second material;

wherein a conduction band energy level of the first material is staggered from a conduction band energy level of the second material, or a valence band energy level of the first material is staggered from a valence band energy level of the second material;

wherein at least one of the conduction band energy level of the first material and the conduction band energy level of the second material is less than 0 eV; and wherein the forming of the first photocatalytic layer on the substrate and the forming of the oxide active layer on the first photocatalytic layer comprises:

mixing and disposing the first material and the second material on the substrate to form the first photocatalytic layer; and forming the oxide active layer on the first photocatalytic layer.

16. The method for fabricating the display panel according to claim 15, wherein at least one of a band gap of the first material and a band gap of the second material is greater than 1.23 eV.

17. The method for fabricating the display panel according to claim 16, wherein at least one of the band gap of the first material and the band gap of the second material is greater than 1.8 eV.

18. The method for fabricating the display panel according to claim 17, wherein the first material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn-$Fe_2O_3$, $Ta_2O_5$, Pt, $Ta_3N_5$, g-$C_3N_4$, $BiFeO_3$, CoOx-$MO_2N$, $Ge_3N_4$, $ZnInS_4$, $Cs_2O$, $Bi_2O_3$, InSe, or $Zr_2CO_2$, and the second material comprises $TiO_2$, $\alpha$-$Ga_2O_3$, $\beta$-$Ga_2O_3$, GaN, ZnO, $Ti_3C_2$, CdS, $BiVO_4$, NiO, $SrTiO_3$, $SnO_2$, $NiGa_2O_4$, $WO_3$, $C_3N_4$, Mn-$Fe_2O_3$, $Ta_2O_5$, Pt, $Ta_3Ns$, g-$C_3N_4$, $BiFeO_3$, CoOx-$MO_2N$, $Ge_3N_4$, $ZnInS_4$, $Cs_2O$, $Bi_2O_3$, InSe, or $Zr_2CO_j$.

19. The method for fabricating the display panel according to claim 15, wherein the forming the first photocatalytic layer on the substrate and forming the oxide active layer on the first photocatalytic layer comprises:

forming a first photocatalytic sublayer of the first photocatalytic layer with the first material on the substrate;

forming a second photocatalytic sublayer of the first photocatalytic layer with the second material on the first photocatalytic sublayer; and forming the oxide active layer on the second photocatalytic sublayer.

20. The method for fabricating the display panel according to claim 15, before the forming the first photocatalytic layer on the substrate and forming the oxide active layer on the first photocatalytic layer, further comprising:

forming a gate electrode on the substrate; and forming an insulating layer on the gate electrode.

\* \* \* \* \*